US010864597B2

(12) United States Patent
Yoshida et al.

(10) Patent No.: US 10,864,597 B2
(45) Date of Patent: Dec. 15, 2020

(54) ULTRASONIC BONDING TOOL, METHOD FOR MANUFACTURING ULTRASONIC BONDING TOOL, ULTRASONIC BONDING METHOD, AND ULTRASONIC BONDING APPARATUS (71) Applicant: TOSHIBA MITSUBISHI-ELECTRIC INDUSTRIAL SYSTEMS CORPORATION, Minato-ku (JP)

(72) Inventors: Akio Yoshida, Tokyo (JP); Masahisa Kogura, Tokyo (JP)

(73) Assignee: Toshiba Mitsubishi-Electric Industrial Systems Corporation, Tokyo (JP)

( * ) Notice: Subject to any disclaimer, the term of this patent is extended or adjusted under 35 U.S.C. 154(b) by 312 days.

(21) Appl. No.: 14/992,839

(22) Filed: Jan. 11, 2016

(65) Prior Publication Data
US 2016/0121424 A1  May 5, 2016

Related U.S. Application Data (62) Division of application No. 13/379,669, filed as application No. PCT/JP2009/061384 on Jun. 23, 2009.

(51) Int. Cl.
B32B 37/10 (2006.01)
B23K 20/10 (2006.01)
(Continued)

(52) U.S. Cl.
CPC ............ B23K 20/106 (2013.01); B23K 20/22 (2013.01); B24B 7/16 (2013.01); B24B 19/02 (2013.01);
(Continued)

(58) Field of Classification Search
None
See application file for complete search history.

(56) References Cited

U.S. PATENT DOCUMENTS 3,750,926 A    8/1973  Sakamoto et al.
4,776,509 A   10/1988  Pitts et al.
(Continued)

FOREIGN PATENT DOCUMENTS

CN    1814388 A    8/2006
CN  101341585 A    1/2009
(Continued)

OTHER PUBLICATIONS http://www.grahamoptical.com/flatrough.html, Apr. 22, 2013.*
(Continued)

Primary Examiner — Erin B Saad
Assistant Examiner — Carlos J Gamino
(74) Attorney, Agent, or Firm — Xsensus LLP (57) ABSTRACT An object of the present invention is to provide an ultrasonic bonding tool capable of bonding a lead wire, without any trouble, even to a surface of a thin-film base having a plate thickness of 2 mm or less such as a glass substrate. In the present invention, a surface portion of a chip portion (1c) of an ultrasonic bonding tool (1) used in an ultrasonic bonding apparatus has a plurality of planar portions (10) formed so as to be separated from one another, and a plurality of concavities (11) formed between the plurality of planar portions. Each of the plurality of planar portions (10) has a flatness of 2 μm or less.

9 Claims, 6 Drawing Sheets (51) Int. Cl.
  *B23K 20/22* (2006.01)
  *B24B 27/06* (2006.01)
  *B24B 19/16* (2006.01)
  *B24B 19/02* (2006.01)
  *B24B 7/16* (2006.01)
  *B24C 1/00* (2006.01)
  *B23K 103/00* (2006.01)

(52) U.S. Cl.
  CPC .......... *B24B 19/16* (2013.01); *B24B 27/0633* (2013.01); *B24C 1/00* (2013.01); *B23K 2103/54* (2018.08); *H01L 2224/48456* (2013.01)

(56) References Cited

U.S. PATENT DOCUMENTS

| | | | |
|---|---|---|---|
| 4,958,762 | A | 9/1990 | Shimizu et al. |
| 5,816,472 | A | 10/1998 | Linn |
| 5,868,301 | A | 2/1999 | Distefano et al. |
| 6,089,438 | A | 7/2000 | Suzuki et al. |
| 6,494,976 | B1 | 12/2002 | Hayashi et al. |
| 6,523,732 | B1 | 2/2003 | Popoola et al. |
| 6,676,004 | B1 * | 1/2004 | Trapp ............... B23K 20/1255 228/112.1 |
| 6,824,630 | B2 | 11/2004 | Oishi et al. |
| 6,840,424 | B2 | 1/2005 | Sung |
| 7,264,146 | B2 | 9/2007 | Takeuchi et al. |
| 7,337,938 | B2 | 3/2008 | Noro |
| 7,934,633 | B2 | 5/2011 | Delsman et al. |
| 2005/0205641 | A1 | 9/2005 | Takeuchi et al. |
| 2006/0163315 | A1 | 7/2006 | Delsman et al. |
| 2006/0175584 | A1 | 8/2006 | Kwon et al. |
| 2006/0231592 | A1 | 10/2006 | Takeuchi et al. |
| 2009/0230172 | A1 | 9/2009 | Ogashiwa et al. |
| 2012/0118609 | A1 | 5/2012 | Yoshida et al. |
| 2013/0139955 | A1 | 6/2013 | Regenberg et al. |

FOREIGN PATENT DOCUMENTS

| | | |
|---|---|---|
| JP | 2-58845 | 2/1990 |
| JP | 2-35668 U | 3/1990 |
| JP | 05021541 A | 1/1993 |
| JP | 2002-71748 | 3/2002 |
| JP | 2005-56928 | 3/2005 |
| JP | 2005-159061 | 6/2005 |
| JP | 2005-254323 | 9/2005 |
| JP | 2006-210534 | 8/2006 |
| JP | 2007-330851 | 12/2007 |
| JP | 2008-638 | 1/2008 |
| WO | WO8901384 A1 | 2/1989 |

OTHER PUBLICATIONS https://www.reference.com/art-literature/shot-blasting-c6ba80d4343cff3b, Dec. 16, 2016.*
International Search Report dated Sep. 15, 2009, in PCT/JP2009/061384.
International Preliminary Report on Patentability and Written Opinion dated Jan. 12, 2012, in PCT/JP2009/061384, filed Jun. 23, 2009 (with english translation).
Japanese Office Action dated Oct. 23, 2012 in Patent Application No. 2011-519412 with Partial English Translation.
Search Report dated Apr. 30, 2014, in Chinese Patent Application No. 200980160117.3 with partial English translation.
Korean Office Action dated Feb. 21, 2013 in Patent Application No. 10-2011-7030481 (with partial English translation).
Metal Improvement Company "Shot Peening Applications", 2005.
Extended European Search Report dated Jun. 12, 2017 in Patent Application No. 09846483.7.

* cited by examiner

ULTRASONIC BONDING TOOL, METHOD
FOR MANUFACTURING ULTRASONIC
BONDING TOOL, ULTRASONIC BONDING
METHOD, AND ULTRASONIC BONDING
APPARATUS

CROSS-REFERENCE TO RELATED
APPLICATIONS

This application is a divisional application of U.S. patent application Ser. No. 13/379,669, filed on Feb. 8, 2012, which is a U.S. national stage entry under 35 U.S.C, § 371 of International Application No. PCT/JP09/061384, filed on Jun. 23, 2009. The entire contents of each of the above applications are incorporated by reference herein for all purposes.

TECHNICAL FIELD

The present invention relates to an ultrasonic bonding tool used in an ultrasonic bonding apparatus, and particularly to a structure of a chip portion that is a distal end portion of the ultrasonic bonding tool.

BACKGROUND ART

An ultrasonic bonding apparatus can be mentioned as an apparatus for bonding an aluminum-based material to a steel material that is a dissimilar metal with a high bonding strength or as an apparatus for bonding a to-be-bonded member such as a lead wire for external connection onto a bonding object portion of an electronic device or the like. In ultrasonic bonding utilizing ultrasonic vibration produced by the ultrasonic bonding apparatus, a stress caused by vertical pressure application to a bonding interface and a repetitive stress caused by a high vibration acceleration in a parallel direction are given so that frictional heat is generated in the bonding interface. Thereby, atoms of the to-be-bonded member are diffused and thus bonding can be made. Such an ultrasonic bonding apparatus includes an ultrasonic bonding tool having a chip portion that is brought into contact with the to-be-bonded member. This ultrasonic bonding tool is disclosed in, for example, Patent Document 1.

PRIOR-ART DOCUMENTS

Patent Documents

Patent Document 1: Japanese Patent Application Laid-Open No. 2005-254323

SUMMARY OF THE INVENTION

Problems to be Solved by the Invention

Here, as described above, the ultrasonic bonding apparatus performs an ultrasonic bonding operation in which both the application of pressure from the upper side and the application of ultrasonic vibration are made. Thus, the bonding object portion needs to be resistant to the ultrasonic bonding operation. Therefore, in apparatuses including the ultrasonic bonding apparatus disclosed in the Patent Document 1, it is not assumed that a thin-film base, such as a glass substrate, having a relatively small plate thickness and thus having a small resistance is used as the bonding object portion mentioned above, and means for bonding a lead wire onto a surface of the thin-film base has not been considered.

To solve the above-described problem, an object of the present invention is to provide an ultrasonic bonding tool capable of bonding a to-be-bonded member even to a surface of a thin-film base having a plate thickness of 2 mm or less such as a glass substrate or the like.

Means for Solving the Problems

An ultrasonic bonding tool according to the present invention is an ultrasonic bonding tool used in an ultrasonic bonding apparatus that applies pressure from an upper side to a to-be-bonded member placed on a surface of a thin-film base and applies ultrasonic vibration thereto to thereby bond the to-be-bonded member onto the surface of the thin-film base, wherein the ultrasonic bonding tool has, at a distal end portion thereof, a chip portion that is brought into contact with the to-be-bonded member at a time of ultrasonic bonding, a surface portion of the chip portion which is brought into contact with the to-be-bonded member has a plurality of planar portions formed so as to be separated from one another and a plurality of concavities formed between the plurality of planar portions, the plurality of planar portions having a flatness of 2 μm or less.

Effects of the Invention

In the ultrasonic bonding tool according to the present invention, the surface portion of the chip portion which is brought into contact with the to-be-bonded member has the plurality of planar portions formed so as to be separated from one another and the plurality of concavities formed between the plurality of planar portions, and the plurality of planar portions 10 have a flatness of 2 μm or less.

Therefore, the ultrasonic bonding method using the ultrasonic bonding apparatus having the ultrasonic bonding tool according to the present invention provides an effect that the to-be-bonded member can be bonded, without any trouble, even onto the surface of the thin-film base having a plate thickness of 2 mm or less such as a glass substrate.

These and other objects, features, aspects and advantages of the present invention will become more apparent from the following detailed description of the present invention when taken in conjunction with the accompanying drawings.

EMBODIMENT FOR CARRYING OUT THE INVENTION

Embodiment 1

Figure 1:
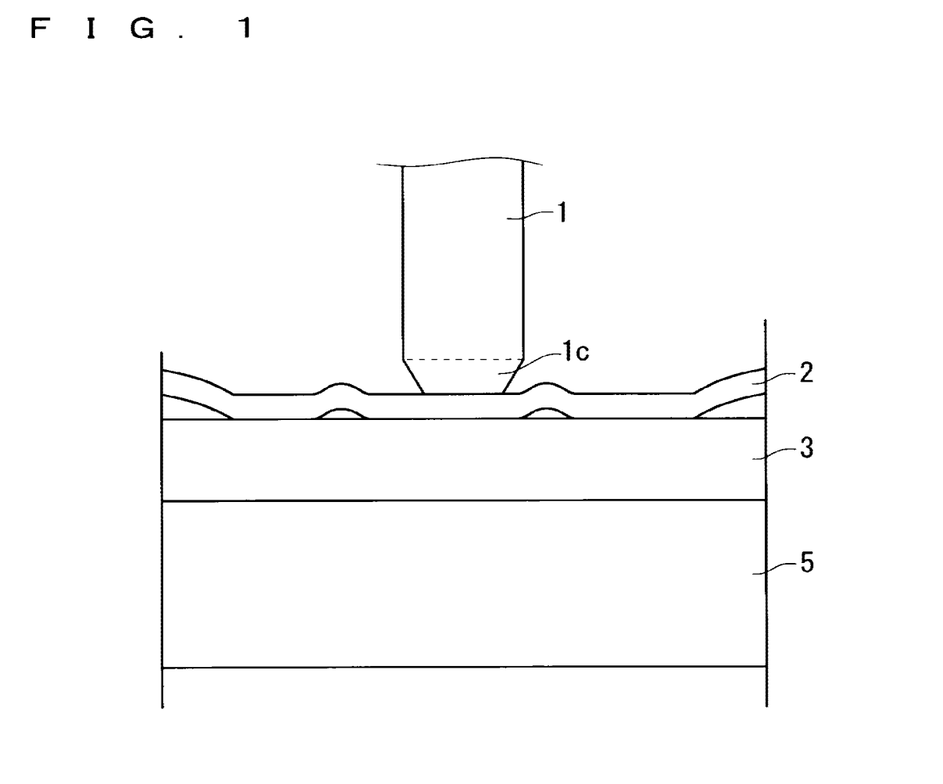
FIG. 1 A cross-sectional view schematically showing a status of ultrasonic bonding performed by an ultrasonic bonding tool according to an embodiment 1 of the present invention.

FIG. 1 is a cross-sectional view schematically showing a status of ultrasonic bonding performed by an ultrasonic bonding tool 1 according to an embodiment 1 of the present invention.

As shown in FIG. 1, a glass substrate 3 that is a thin-film base having a plate thickness of about 0.7 to 2.0 mm is fixed to a table (anvil) 5, and an aluminum-made lead wire 2 (to-be-bonded member) for external connection having a plate thickness of about 0.1 to 0.2 mm is arranged at a predetermined position on a surface of the glass substrate 3. Then, an ultrasonic bonding operation is performed in which vertical pressure is applied to a bonding surface to be bonded to the lead wire 2 via a chip portion 1c of the ultrasonic bonding tool 1 while the ultrasonic bonding tool 1 is ultrasonically vibrated in a horizontal direction to largely deform the bonding surface. Thereby, the lead wire 2 and the glass substrate 3 are solid-state bonded to each other at a bonding interface between the lead wire 2 and the glass substrate 3.

Figure 2:
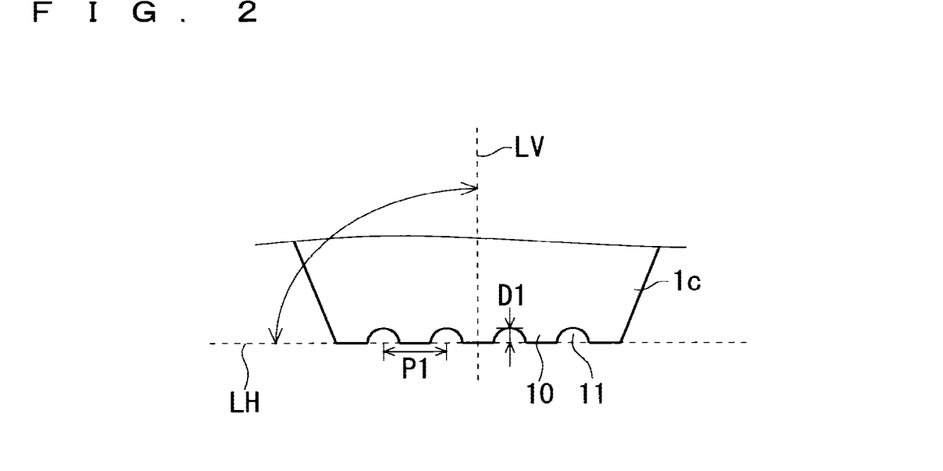
FIG. 2 A cross-sectional view showing a cross-sectional structure of a surface portion of a chip portion according to the embodiment 1.
Figure 3:
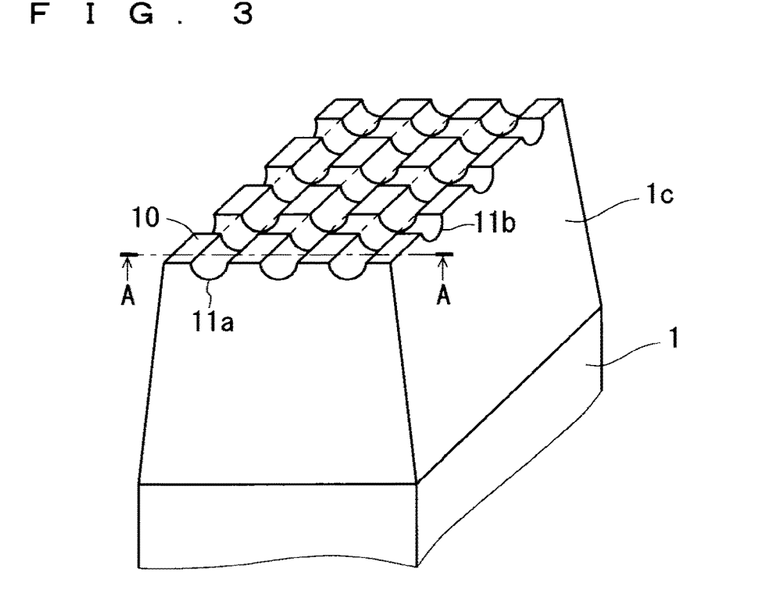
FIG. 3 A perspective view schematically showing a planar structure of the surface portion of the chip portion according to the embodiment 1.

FIG. 2 is a cross-sectional view showing a cross-sectional structure of a surface portion of the chip portion 1c. FIG. 3 is a perspective view schematically showing a planar structure of the surface portion of the chip portion 1c. FIG. 2 corresponds to an inverted version of a cross-section taken along the line A-A of FIG. 3. As shown in FIGS. 2 and 3, on a surface of the chip portion 1c, a plurality of planar portions 10 are formed so as to be separated from one another by a plurality of concavities 11 (in FIG. 3, first grooves 11a and second grooves 11b).

Figure 4:
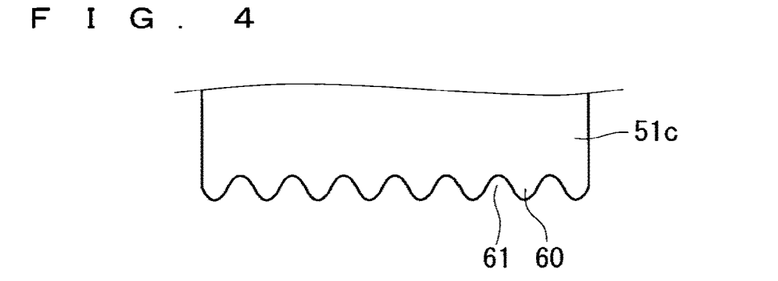
FIG. 4 A cross-sectional view showing a cross-sectional structure of a surface portion of an ordinary chip portion of an ultrasonic bonding tool.

FIG. 4 is a cross-sectional view showing a cross-sectional structure of a surface portion of an ordinary chip portion 51c of an ultrasonic bonding tool. As shown in FIG. 4, the chip portion 51c has a plurality of planar portions 60 formed so as to be separated from one another by a plurality of concavities 61 through a wire-cutting process. In general, each of the plurality of planar portions 60 is substantially in the shape of a protrusion, and does not maintain a high degree of flatness. Therefore, as a surface structure of the chip portion 51c, unevenness of a few tens of µm order is formed by the planar portions 60 and the concavities 61. This is not a problem in the conventional method, because a large amount of deformation in a direction of the plate thickness caused by the ultrasonic bonding is acceptable.

On the other hand, in the chip portion 1c of the ultrasonic bonding tool 1 according to embodiment 1, as shown in FIG. 2, a horizontal line LH defined by a plane where surfaces of the planar portions 10 are formed is accurately set to be 90 degrees with respect to the vertical line LV, and the planar portions 10 are accurately formed so as to have a flatness of 2 µm or less. An interval P1 between the concavities 11 and 11 is set to be approximately 1.0 mm or less, and a depth D1 to the innermost of the concavity 11 is set to be approximately 0.15 mm or less. In this manner, the chip portion 1c of the ultrasonic bonding tool 1 according to the embodiment 1 is structured with an accuracy completely different from the ordinary ultrasonic bonding tool 51c, and enables the lead wire 2 to be bonded without damaging the glass substrate 3 which is susceptible to fracture.

FIG. 3 shows an example in which the plurality of concavities 11 of FIG. 2 are formed by a plurality of first grooves 11a and a plurality of second grooves 11b that cross each other in the vertical direction. That is, the concavities 11 are formed in a matrix by being separated from each other by the plurality of first grooves 11a provided substantially in a longitudinal direction in FIG. 3 and the second grooves 11b provided in a lateral direction in FIG. 3, so that the plurality of planar portions 10 each having a rectangular shape in a plan view are formed. The plurality of planar portions 10 define a single surface having a flatness of 2 µm or less.

Figure 5:
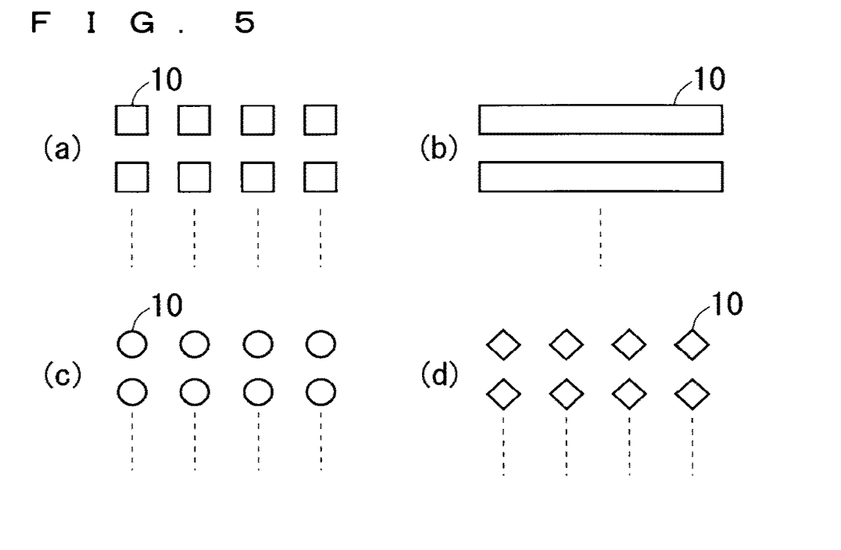
FIG. 5 An explanatory diagram showing an exemplary pattern of forming a plurality of planar portions of the chip portion according to the embodiment 1.

FIG. 5 is an explanatory diagram showing an exemplary pattern of forming the plurality of planar portions 10. In FIG. 5, the region other than the planar portions 10 is the concavities 11, but the concavities 11 are not shown.

As shown in FIG. 5(a), a plurality of planar portions 10 each having a rectangular shape in a plan view may be arranged in a matrix (corresponding to FIG. 3), and as shown in FIG. 5(b), a plurality of planar portions 10 each having an elongated rectangular shape in a plan view may be arranged in parallel. As shown in FIG. 5(c), a plurality of planar portions 10 each having a circular shape in a plan view may be arranged in a matrix, and as shown in FIG. 5(d), a plurality of planar portions 10 each having a rhombic shape in a plan view may be arranged in a matrix.

Figure 6:
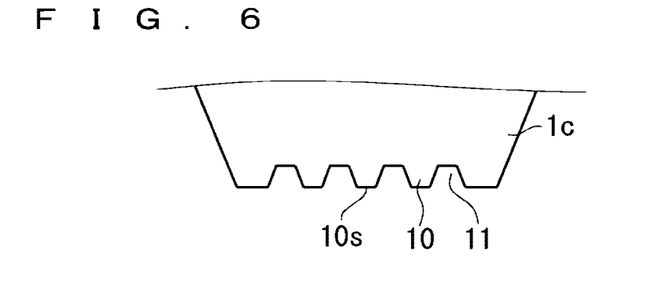
FIG. 6 A cross-sectional view showing another cross-sectional structure of the chip portion according to the embodiment 1.

FIG. 6 is a cross-sectional view showing another cross-sectional structure of the chip portion 1c. As shown in FIG. 6, the concavity 11 may be formed such that its cross-section has an inverted trapezoidal shape.

Hereinafter, an effect obtained by the chip portion 1c according to the embodiment 1 will be described in comparison with the ordinary chip portion 51c shown in FIG. 4.

In a case of the ordinary chip portion 51c, as described above, an uneven shape of a few tens of µm order is formed as the surface structure, and therefore if the ultrasonic bonding of FIG. 1 is performed using an ultrasonic bonding tool having the chip portion 51c instead of the ultrasonic bonding tool 1, a concentrated load acts on the planar portions 60 that form the protrusions, which places the glass substrate 3 at a high risk of cracking, to make it substantially impossible to bond the lead wire 2 without fracturing the glass substrate 3.

In the chip portion 1c of the ultrasonic bonding tool 1 according to embodiment 1, on the other hand, the plurality of planar portions 10 have a highly accurate flatness of 2 µm or less, which can reduce the above-mentioned concentrated load in each of the plurality of planar portions 10. Moreover, since the plurality of planar portions 60 are formed so as to be separated from one another, a stress is distributed among the plurality of planar portions to thereby reduce a stress acting on one planar portion. To further reduce a stress acting on each individual planar portion 10, it is desirable that the planar portion 60 has a circular shape in a plan view as shown in FIG. 5(*c*).

Additionally, the plurality of concavities 11 make it easy to hold the lead wire 2 so as not to fall off during the ultrasonic bonding operation performed by the ultrasonic bonding tool 1 (holding function) and to separate the ultrasonic bonding tool 1 from the lead wire 2 after completion of the ultrasonic bonding operation by the ultrasonic bonding tool 1 (separating function).

In the ultrasonic bonding tool 1 according to the embodiment 1, the surface portion of the chip portion 1*c* which is brought into contact with the lead wire 2 has the plurality of planar portions 10 separated from one another and the plurality of concavities 11 each formed between the plurality of planar portions. The plurality of planar portions 10 define one plane having a flatness of 2 μm or less.

Therefore, an ultrasonic bonding method using an ultrasonic bonding apparatus having the ultrasonic bonding tool 1 according to the embodiment 1 provides an effect that the lead wire 2 can be bonded without any trouble on the surface of the glass substrate 3 that is a thin-film base having a plate thickness of 2 mm or less.

Embodiment 2

Figure 7:
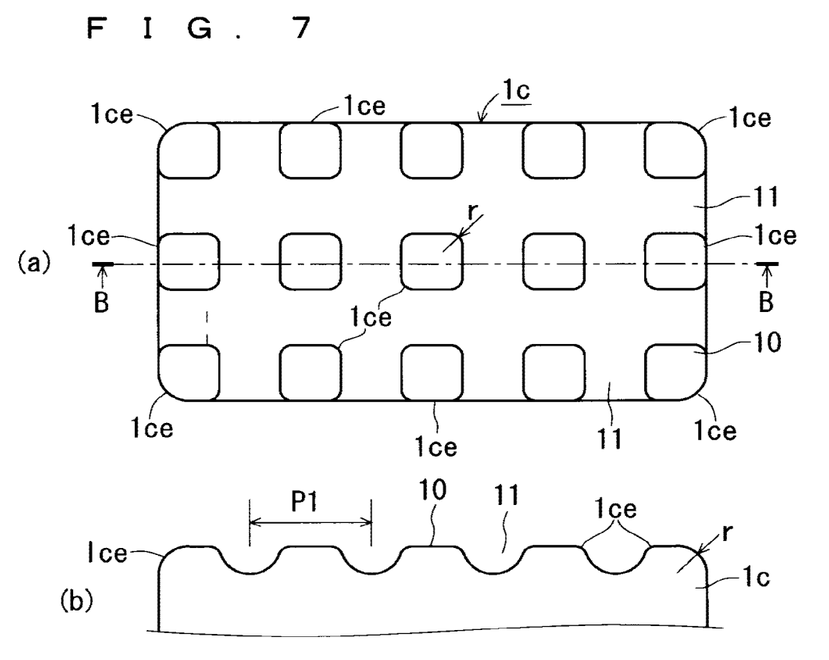
FIG. 7 An explanatory diagram showing a shape of a chip portion according to an embodiment 2 of the present invention.

FIG. 7 is an explanatory diagram showing the shape of the chip portion 1*c* according to an embodiment 2 of the present invention. FIG. 7(*a*) shows a planar structure of the chip portion 1*c*, and FIG. 7(*b*) shows a cross-sectional structure of the chip portion 1*c*. FIG. 7(*b*) corresponds to a cross-section taken along the line B-B of FIG. 7(*a*).

As shown in FIGS. 7(*a*) and (*b*), the chip portion 1*c* has a rectangular shape in a plan view, and an acute angled end portion (edge) of an outer peripheral portion 1*ce* of each of the plurality of planar portions 10 is chamfered in both of a horizontal plane (plane parallel to the horizontal line LH (see FIG. 2)) and a vertical plane (plane parallel to the vertical line LV (see FIG. 2)) and rounded at a predetermined curvature radius r.

In this manner, the chip portion 1*c* of the ultrasonic bonding tool 1 according to the embodiment 2 is characterized in that the acute angled end portion (edge) of the outer peripheral portion 1*ce* of each of the plurality of planar portions 10 is chamfered and rounded.

In the ultrasonic bonding operation, the plurality of planar portions 10 of the chip portion 1*c* are vibrated in a direction parallel to the surface of the glass substrate 3 due to the ultrasonic vibration. Accordingly, in each of the plurality of planar portions 10, a vertical vibration of micron order occurs back and forth, right and left, which tends to damage the lead wire 2 and the glass substrate 3 because of a concentrated load acting thereon.

However, in the plurality of planar portions 10 of the chip portion 1*c* according to the embodiment 2, the edge of the outer peripheral portion 1*ce* is chamfered and rounded. Therefore, the concentrated load on the outer peripheral portion 1*ce* is reduced, and thus the effect that the lead wire 2 can be bonded without any trouble on the surface of the glass substrate 3 is obtained more successfully than in the embodiment 1.

Embodiment 3

Figure 8:
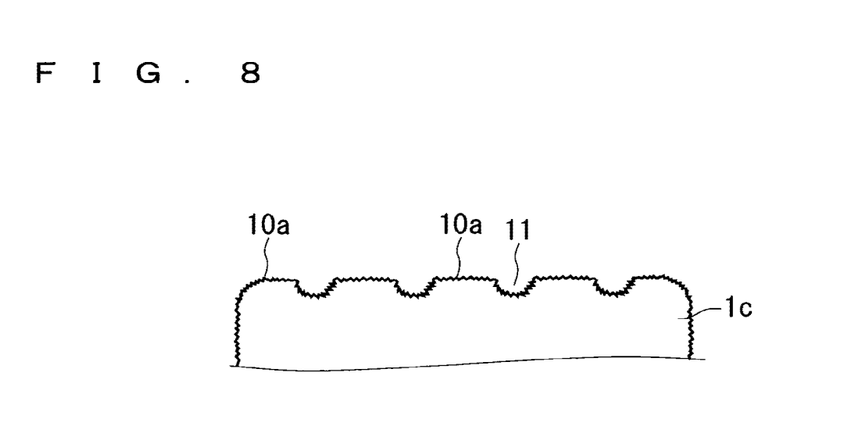
FIG. 8 A cross-sectional view showing a cross-sectional structure of a chip portion according to an embodiment 3 of the present invention.

FIG. 8 is a cross-sectional view showing a cross-sectional structure of the chip portion 1*c* according to the embodiment 3 of the present invention. As shown in FIG. 8, in addition to the feature of the embodiment 2, fine unevenness in a range that satisfies a flatness of 2 μm or less is provided in a planar portion 10*a* of the chip portion 1*c*.

In this manner, the chip portion 1*c* of the ultrasonic bonding tool 1 according to the embodiment 3 is characterized in that the plurality of planar portions 10*a* have fine unevenness in a range that satisfies a flatness of 2 μm or less. Additionally, it is also characterized in that each of the plurality of concavities 11 has fine unevenness.

The fine unevenness of the planar portions 10*a* allows making inroads into an aluminum material of the lead wire 2, and thus the holding function of the chip portion 1*c* for holding the lead wire 2 increases as compared with the embodiment 1 and the embodiment 2. Therefore, the ultrasonic bonding operation can be performed in a state where the chip portion 1*c* and the lead wire 2 are more firmly integrated with each other. Moreover, fine unevenness formed in the plurality of concavities 11 also contributes to enhancement of the effect that the holding function of the chip portion 1*c* for holding the lead wire 2 during the ultrasonic bonding operation increases.

As a result, an ultrasonic bonding apparatus having the ultrasonic bonding tool 1 according to the embodiment 3 provides an energy saving effect that the lead wire 2 can be bonded without any trouble on the surface of the glass substrate 3 by performing an ultrasonic bonding operation with less energy.

Embodiment 4

Figure 9:
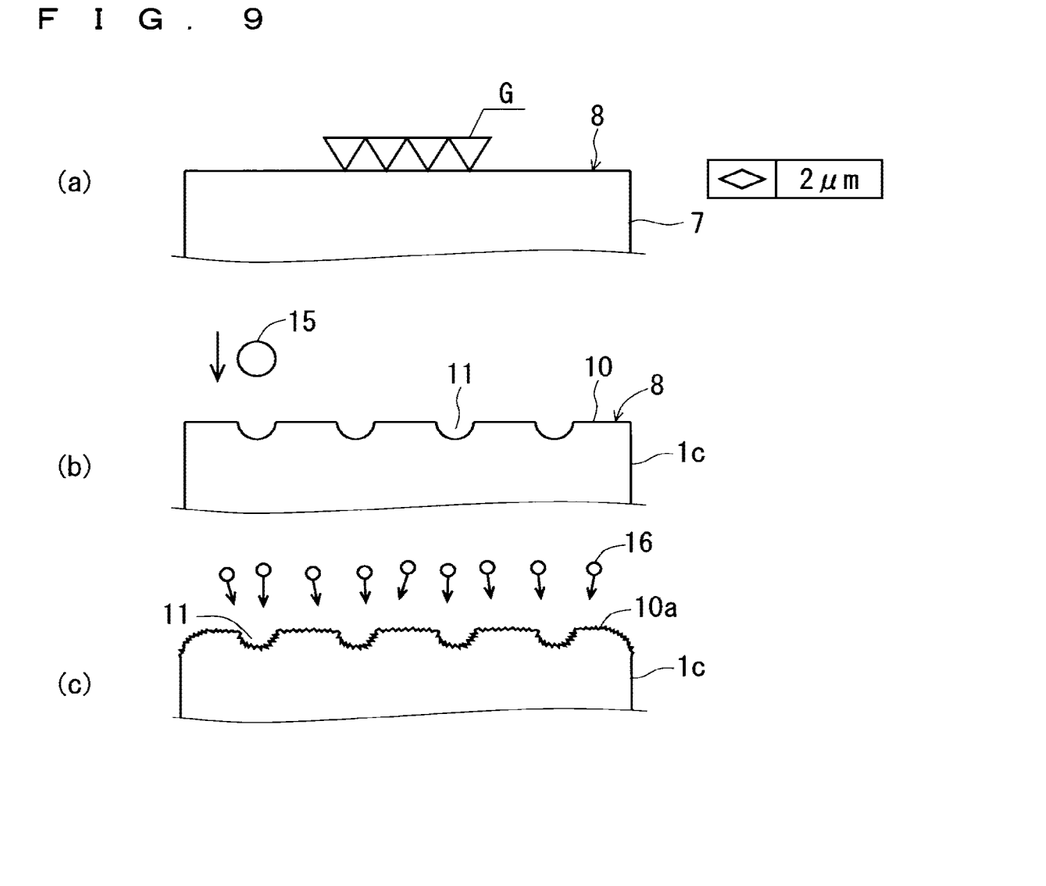
FIG. 9 A cross-sectional view showing a method for manufacturing an ultrasonic bonding tool according to an embodiment 4.

FIG. 9 is a cross-sectional view showing a method for manufacturing the ultrasonic bonding tool 1 according to an embodiment 4. In the following, details of a process for manufacturing the ultrasonic bonding tool 1 will be described with reference to FIG. 9.

Firstly, as shown in FIG. 7(*a*), in a tool original material 7 having a distal planar portion having a flatness of more than 2 μm, from which the ultrasonic bonding tool 1 originates, a grinding process and a polishing process are performed on the distal planar portion, to increase the flatness of a planar area 8 of the tool original material 7 up to 2 μm. The planar area 8 has a rectangular shape in a plan view, though not shown.

Next, as shown in FIG. 9(*b*), the plurality of concavities 11 are selectively formed in the planar area 8 through a grooving process using wire cutting or a cutting wheel.

As a result, the plurality of concavities 11 separate the planar area 8 into the plurality of planar portions 10 each still having a flatness of 2 μm. Thus, the chip portion 1*c* corresponding to the embodiment 1 which includes the plurality of planar portions 10 and the plurality of concavities 11 is completed.

Then, as shown in FIG. 9(*c*), by using a shot-blasting process in which a shooting material 16 is shot from the upper side, the edge of the outer peripheral portion of the planar area 8 (the plurality of planar portions 10) having a rectangular shape is rounded, and the plurality of planar portions 10*a* each having fine unevenness in a range that satisfies a flatness of 2 μm or less are obtained. Consequently, the chip portion 1*c* according to the embodiment 3 is obtained.

Furthermore, as shown in FIG. 9(*c*), if the shot-blasting process is used, fine unevenness is also formed in each of the plurality of concavities 11. Accordingly, the fine unevenness formed in the plurality of concavities 11 also provides the effect that the holding function of the chip portion 1c for holding the lead wire 2 during the ultrasonic bonding operation increases.

In this manner, by the method for manufacturing the ultrasonic bonding tool 1 according to the embodiment 4, the ultrasonic bonding tool 1 having the chip portion 1c according to the embodiment 3 can be obtained.

Embodiment 5

Figure 10:
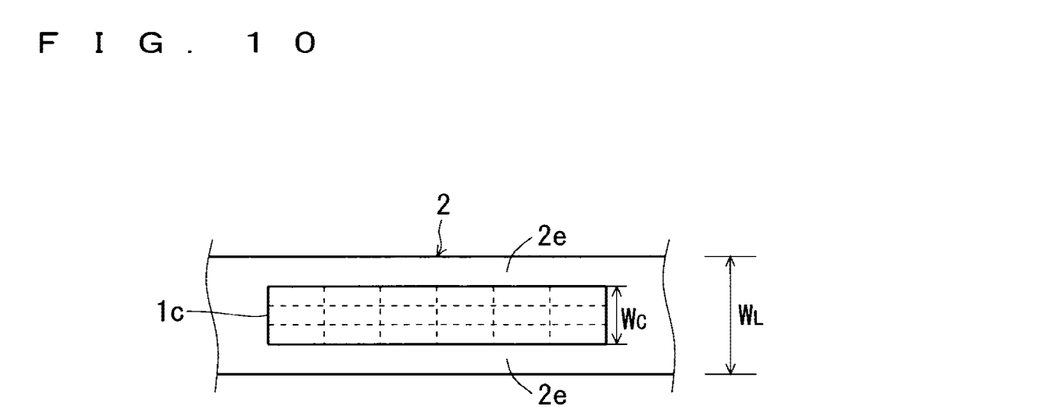
FIG. 10 An explanatory diagram schematically showing a planar structure with respect to an ultrasonic bonding tool and a lead wire in an ultrasonic bonding method according to an embodiment 5.

FIG. 10 is an explanatory diagram schematically showing a planar structure with respect to the ultrasonic bonding tool 1 and the lead wire 2 in an ultrasonic bonding method according to an embodiment 5.

As shown in FIG. 10, a width Wc of formation of the planar area of the chip portion 1c is smaller than a width WL of formation of the lead wire 2. FIG. 10 schematically shows the chip portion 1c in which the broken lines indicate the concavities and the rest are the planar portions.

Accordingly, in the ultrasonic bonding method according to the embodiment 5, a ultrasonic bonding method including the following steps (a) and (b) can be performed by using the ultrasonic bonding tool 1 provided with the chip portion 1c having the width Wc of formation shown in FIG. 10.

In step (a), the lead wire 2 is placed on the surface of the glass substrate 3. Then, in step (b), pressure is applied to the lead wire 2 from the upper side by using the chip portion 1c of the ultrasonic bonding tool 1, and additionally ultrasonic vibration is applied thereto so that the lead wire 2 is bonded to the surface of the glass substrate 3.

In the embodiment 5, during execution of the step (b), the width Wc of formation of the chip portion 1c is set smaller than the width WL of formation of the lead wire 2.

That is, the ultrasonic bonding method according to the embodiment 5 is characterized by allowing the ultrasonic bonding tool 1 to perform the ultrasonic bonding operation while the entire planar area of the chip portion 1c is within a range of the width WL of formation of the lead wire 2.

Since an ultrasonic bonding surface (the planar area of the chip portion 1c) is within a range of the width WL of formation of the lead wire 2, the lead wire 2 inevitably has a blank space 2e where the plate thickness is not reduced after the ultrasonic bonding operation. This can provide an effect of the strength of the lead wire 2 can be improved.

Embodiment 6

Figure 11:
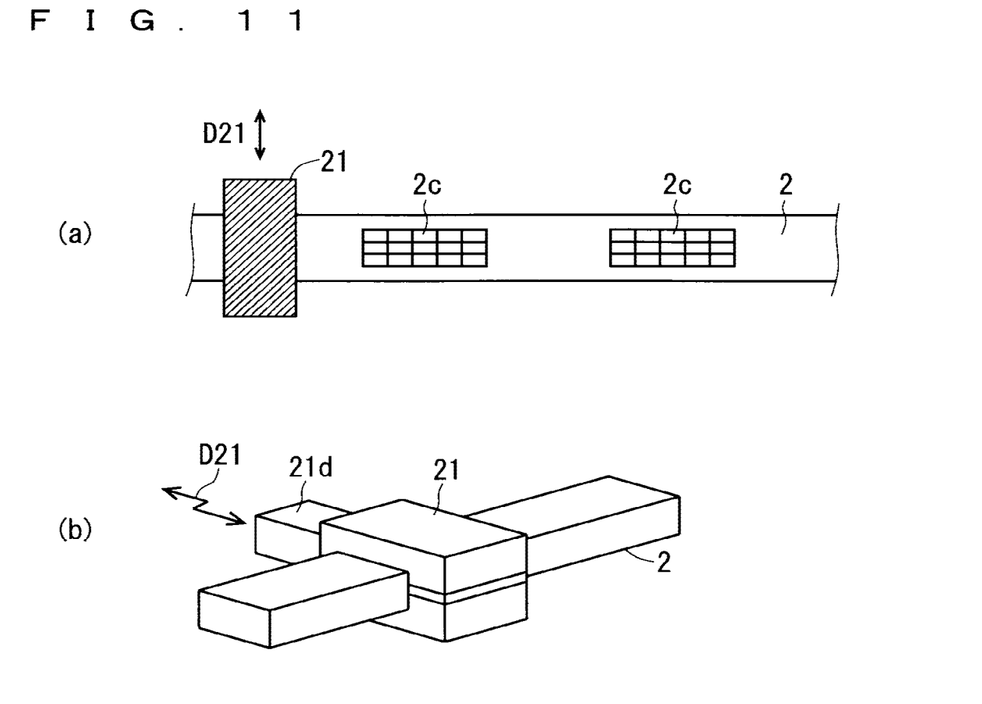
FIG. 11 An explanatory diagram schematically showing a function for adjusting a position of the lead wire, of a lead wire guide mechanism according to an embodiment 6.

FIG. 11 is an explanatory diagram schematically showing a function for adjusting the position of the lead wire 2, of a lead wire guide mechanism 21 used in an ultrasonic bonding method according to an embodiment 6. FIG. 11(a) is a plan view, and FIG. 11(b) is a perspective view.

As shown in FIG. 11, the lead wire guide mechanism 21 is arranged on a transport path of a transport mechanism that places the lead wire 2 at a predetermined position on the surface of the glass substrate 3. The lead wire guide mechanism 21 can move the lead wire 2 in a widthwise direction D21, to thereby control a position where the lead wire 2 is to be arranged relative to the planar area of the chip portion 1c. In FIG. 11, two chip-marked portions 2c marked by the chip portion 1c after the ultrasonic bonding operation are shown.

Monitor means (not shown) such as a CCD camera for monitoring a planar positional relationship between the chip portion 1c and the lead wire 2 is arranged at a portion where the chip portion 1c and the lead wire 2 are bonded to each other. A monitoring result indicating the planar positional relationship between the chip portion 1c and the lead wire 2 can be obtained by image processing performed by the monitor means.

Accordingly, based on the monitoring result of the monitor means, the lead wire guide mechanism 21 can control the planar position of the lead wire 2 such that the center of the planar area of the chip portion 1c can be always located in a central portion of the lead wire 2 in a widthwise direction thereof, in other words, such that the entire planar area can fall within the width WL of formation of the lead wire 2 without fail.

In this manner, in the ultrasonic bonding method according to the embodiment 6, by providing the lead wire guide mechanism 21 and the monitor means, a method further including the following steps (c) and (d) can be achieved as an improvement in the ultrasonic bonding method according to the embodiment 5.

In step (c), the monitor means detects a position of the chip portion 1c with respect to the widthwise direction of the lead wire 2.

In step (d), based on the monitoring result of the step (c), a relative positional relationship between the lead wire 2 and the chip portion 1c is adjusted by the lead wire guide mechanism 21, in such a manner that pressure can be applied to the lead wire 2 within the width WL of formation of the lead wire 2 during execution of the step (b) of the embodiment 5 described above.

In this manner, the ultrasonic bonding method according to the embodiment 6 provides an effect that the relative positional relationship between the lead wire 2 and the chip portion 1c is always adjusted by using the lead wire guide mechanism 21 shown in FIG. 11, to thereby ensure that the ultrasonic bonding surface can fall within the width WL of formation of the lead wire 2 without fail.

Embodiment 7

Figure 12:
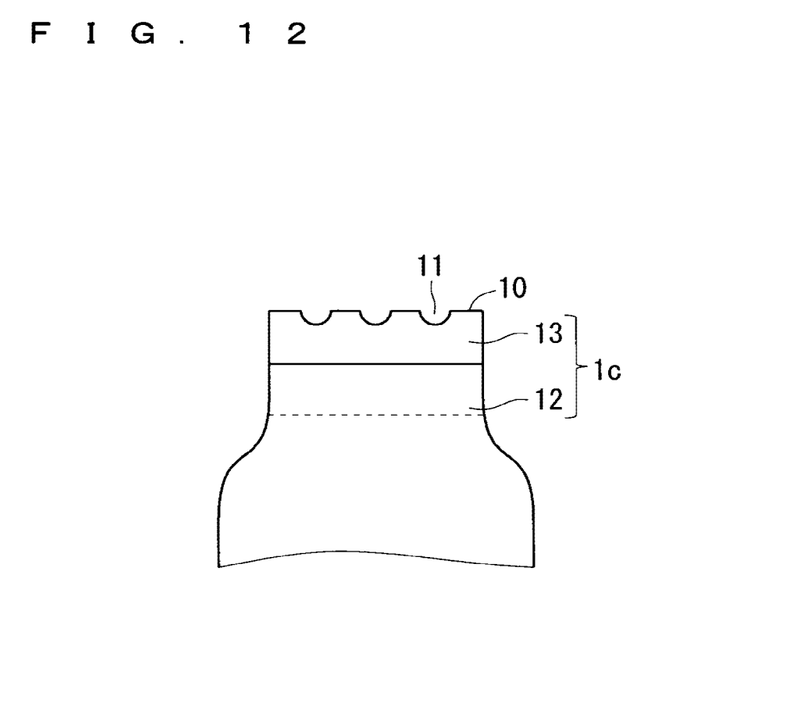
FIG. 12 A cross-sectional view showing a cross-sectional structure of a chip portion according to an embodiment 7 of the present invention.

FIG. 12 is a cross-sectional view showing a cross-sectional structure of the chip portion 1c according to an embodiment 7 of the present invention. As shown in FIG. 12, the chip portion 1c is formed as a layered structure of a base layer 12 made of a steel material and a front layer 13 made of a super-steel material (such as tungsten carbide). The front layer 13 is formed by brazing the base layer 12. The super-steel material used for the front layer 13 has a higher hardness and more excellent wearing resistance than those of the steel material used for the base layer 12. In the chip portion 1c of the embodiment 7, too, the features of the embodiment 1 shown in FIGS. 1 to 6 are provided.

Thus, the chip portion 1c according to the embodiment 7 includes the base layer 12 (first layer) made of a steel material, and the front layer 13 (second layer) made of a super-steel material that has a higher hardness (smaller degree of wear) than that of the steel material, and the front layer 13 serves as a most distal end portion of the chip portion 1c. This provides an effect that the life of the chip portion 1c can be extended.

Embodiment 8

Figure 13:
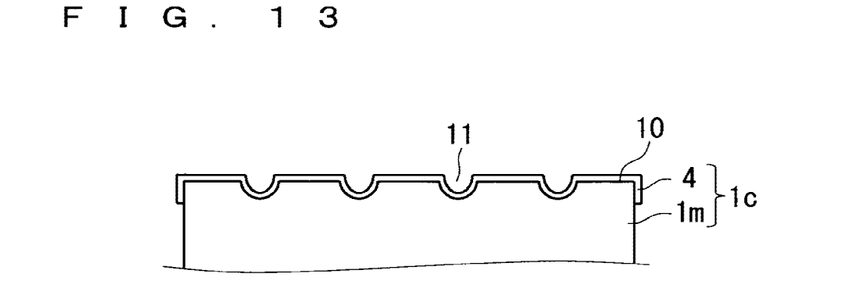
FIG. 13 A cross-sectional view showing a cross-sectional structure of a chip portion according to an embodiment 8 of the present invention.

FIG. 13 is a cross-sectional view showing a cross-sectional structure of the chip portion 1c according to an embodiment 8 of the present invention. As shown in FIG. 13, the chip portion 1c includes a main part 1m (first layer) made of a steel material and having the plurality of planar portions 10 and the plurality of concavities 11, and a DLC (Diamond Like Carbon) film 4 (second layer) formed on the entire surface and a part of a side surface of the main part 1m. As compared with the steel material of the main part 1m, the DLC of the DLC film 4 has a lower affinity for aluminum that is a material of the lead wire 2. In the chip portion 1c of the embodiment 8, too, the features of the embodiment 1 shown in FIGS. 1 to 6 are provided.

In this manner, in the chip portion 1c of the ultrasonic bonding tool 1 according to the embodiment 8, the DLC film 4 having a lower affinity for aluminum that is a material of the lead wire 2 is formed on the surface, and therefore an adhesion of the lead wire 2 to the chip portion 1c can be suppressed so that the life of the chip portion 1c can be extended.

Others

In the above-described embodiments, a single-body structure of the glass substrate 3 is shown as the thin-film base. However, needless to say, similarly to the single-body of the glass substrate 3, the present invention is also applicable to a composite structure in which a conductive metal film layer such as a Cr (chromium) or Mo (molybdenum) film layer, a conductive oxide layer such as a ITO, ZnO, or SnO layer, or the like, is laminated on the surface of the glass substrate 3.

Moreover, even in a case of, instead of the glass substrate 3, a substrate made of another material such as a silicon substrate or a ceramic substrate, the present invention is also applicable to the substrate serving as a thin-film base having the above-described single-body structure or composite structure, as long as the substrate is a thin film having a plate thickness of 2 mm or less.

While the invention has been described in detail, the foregoing description is in all aspects illustrative and not restrictive. It is understood that numerous other modifications and variations not illustrated herein can be devised without departing from the scope of the invention.

The invention claimed is:

1. A method for manufacturing an ultrasonic bonding tool, said ultrasonic bonding tool comprising a chip portion at a distal end portion of the tool, the chip portion comprising a surface portion, the surface portion comprising a plurality of planar portions and a plurality of concavities between planar portions of the plurality of planar portions, and the tool being capable of applying ultrasonic vibration, said method for manufacturing the tool comprising:

preparing a tool original material comprising a distal planar portion with a flatness of more than 2 μm;

grinding the tool original material to enhance the flatness of the distal planar portion to a flatness of 2 μm or less;

selectively forming the plurality of concavities by wire cutting or with a cutting wheel, wherein the plurality of concavities separate the distal planar portion into the plurality of planar portions;

shot-blasting an edge of an outer peripheral portion of planar: portions in the plurality of planar portions, thereby rounding the edge; and shot-blasting to form an uneven shape in each planar portion in the plurality of planar portions so as to maintain a flatness of 2 μm or less in the plurality of planar portions and form an uneven shape with a flatness of 0.2 μm or less in the plurality of concavities.

2. The method for manufacturing the ultrasonic bonding tool according to claim 1, wherein the chip portion comprises:

a first layer and a second layer on the first layer as a most distal end portion of the chip portion, and wherein the second layer is harder than the first layer.

3. The method for manufacturing the ultrasonic bonding tool according to claim 1, wherein the chip portion comprises:

a first layer and a second layer on the first layer, as a most distal end portion of the chip portion, and wherein an affinity between the second layer and a material to be bonded is lower than an affinity between the first layer and the material to be bonded.

4. The method for manufacturing the ultrasonic bonding tool according to claim 1, Wherein an interval between adjacent concavities of the plurality of concavities is 1.0 mm or less.

5. The method for manufacturing the ultrasonic bonding tool according to claim 1, wherein an average depth of concavities of the plurality of concavities is 0.15 mm or less.

6. The method for manufacturing the ultrasonic bonding tool according to claim 1, wherein the plurality of concavities comprises a plurality of first grooves and a plurality of second grooves that cross the plurality of first grooves.

7. The method for manufacturing the ultrasonic bonding tool according to claim 1, wherein the planar portions of the plurality of planar portions have a rectangular shape, a circular shape, or a rhombic shape.

8. The method for manufacturing the ultrasonic bonding tool according to claim 2, wherein the first layer comprises a steel material and the second layer comprises tungsten carbide.

9. The method for manufacturing the ultrasonic bonding tool according to claim 1, wherein the tool original material is ground to a flatness of 1 to 2 μm.

* * * * *